US011532841B2

(12) United States Patent
Yamauchi et al.

(10) Patent No.: US 11,532,841 B2
(45) Date of Patent: Dec. 20, 2022

(54) STORAGE BATTERY CONTROL DEVICE

(71) Applicant: Vehicle Energy Japan Inc., Hitachinaka (JP)

(72) Inventors: Shin Yamauchi, Tokyo (JP); Kei Sakabe, Tokyo (JP); Masahiro Yonemoto, Tokyo (JP); Takanori Yamazoe, Tokyo (JP); Keiichiro Ohkawa, Hitachinaka (JP); Ryohhei Nakao, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 170 days.

(21) Appl. No.: 17/134,736

(22) Filed: Dec. 28, 2020

(65) Prior Publication Data

US 2021/0119272 A1    Apr. 22, 2021

Related U.S. Application Data

(63) Continuation of application No. 15/741,784, filed as application No. PCT/JP2016/073215 on Aug. 8, 2016, now Pat. No. 10,879,570.

(30) Foreign Application Priority Data

Sep. 9, 2015   (JP) ................. 2015-177561

(51) Int. Cl.
*H01M 10/42*    (2006.01)
*G01R 31/36*    (2020.01)
(Continued)

(52) U.S. Cl.
CPC ........ *H01M 10/4257* (2013.01); *G01R 31/36* (2013.01); *H01M 10/44* (2013.01);
(Continued)

(58) Field of Classification Search
CPC .. H01M 10/4257; H01M 10/44; H01M 10/48; H01M 10/448; H01M 50/569;
(Continued)

(56) References Cited

U.S. PATENT DOCUMENTS

2011/0260659 A1*  10/2011  Kamachi ............. B60L 15/2009
                                                                318/139
2011/0313603 A1   12/2011  Laberteaux
(Continued)

FOREIGN PATENT DOCUMENTS

EP    2 667 479 A1    11/2013
EP    3 171 186 A1     5/2017
(Continued)

OTHER PUBLICATIONS

International Search Report (PCT/ISA/210) issued in PCT Application No. PCT/JP2016/073215 dated Nov. 15, 2016 with English translation (5 pages).
(Continued)

*Primary Examiner* — Ula C Ruddock
*Assistant Examiner* — Matthew W Van Oudenaren
(74) *Attorney, Agent, or Firm* — Crowell & Moring LLP

(57) ABSTRACT

A current of a storage battery is appropriately controlled depending on the situation. In a battery controller, a battery information acquiring unit acquires information on the storage battery. A first allowable current calculating unit calculates a first allowable current of a battery module in accordance with a rated value of a component through which a current flows by charging or discharging of the battery module. A second allowable current calculating unit calculates a second allowable current of the battery module in accordance with an SOC of the battery module on the basis of the information acquired by the battery information acquiring unit. A third allowable current calculating unit
(Continued)

calculates a third allowable current of the battery module in accordance with an SOH of the battery module on the basis of the information acquired by the battery information acquiring unit.

4 Claims, 12 Drawing Sheets

(51) Int. Cl.
  *H01M 10/44* (2006.01)
  *H02J 7/00* (2006.01)
  *H01M 10/48* (2006.01)
  *B60L 3/00* (2019.01)

(52) U.S. Cl.
  CPC . *H02J 7/00* (2013.01); *B60L 3/00* (2013.01); *H01M 10/48* (2013.01); *H01M 2010/4271* (2013.01)

(58) Field of Classification Search
  CPC .. G01R 31/36; G01R 31/3647; G01R 31/392; G01R 31/367; B60L 3/00; B60L 58/10; B60L 58/12; B60L 58/13; B60L 58/14; B60L 58/15; B60L 58/16; H02J 7/00
  See application file for complete search history.

(56) References Cited

U.S. PATENT DOCUMENTS

| | | | | |
|---|---|---|---|---|
| 2013/0221903 A1* | 8/2013 | Hwang | ............... | H02J 7/00714 320/137 |
| 2014/0203783 A1* | 7/2014 | Kiesel | ................... | H01M 10/44 320/167 |
| 2014/0339891 A1* | 11/2014 | Ohkawa | .................. | B60L 3/003 320/134 |
| 2016/0233693 A1 | 8/2016 | Suzuki | | |

FOREIGN PATENT DOCUMENTS

| | | | |
|---|---|---|---|
| JP | 2015-110379 A | | 6/2015 |
| JP | 2015-119558 A | | 6/2015 |
| WO | WO 2013/094057 A1 | | 6/2013 |
| WO | WO2013094057 | * | 6/2013 |
| WO | WO 2014/027389 A1 | | 2/2014 |

OTHER PUBLICATIONS

Japanese-language Written Opinion (PCT/ISA/237) issued in PCT Application No. PCT/JP2016/073215 dated Nov. 15, 2016 (4 pages).
Extended European Search Report issued in counterpart European Application No. 16844100.4 dated Apr. 4, 2019 (eight (8) pages).
Japanese-language Office Action issued in counterpart Japanese Application No. 2015-177561 dated Apr. 23, 2019 with English translation (eight (8) pages).

* cited by examiner

STORAGE BATTERY CONTROL DEVICE

CROSS REFERENCE TO RELATED APPLICATIONS

This application is a continuation of U.S. patent application Ser. No. 15/741,784, filed Jan. 4, 2018, which is a 371 of International Application No. PCT/JP2016/073215, filed Aug. 8, 2016, which claims the priority of Japanese Patent Application No. 2015-177561, filed Sep. 9, 2015, the disclosure of which are expressly incorporated by reference herein.

TECHNICAL FIELD

The present invention relates to a storage battery control device.

BACKGROUND ART

Conventionally, in-vehicle battery systems, mounted on a hybrid electric vehicle (HEV) or a plug-in hybrid electric vehicle (PHEV) and using a lithium ion secondary battery as a storage battery, are in use. In such in-vehicle battery systems, it is necessary to limit the current flowing in a storage battery within a predetermined range from the perspective of safety of components and deterioration prevention. For example, PTL 1 discloses a technique for setting an upper limit value of the current in accordance with the degree of deterioration of a storage battery.

CITATION LIST

Patent Literature

PTL 1: International Publication No. 2013-094057

SUMMARY OF INVENTION

Technical Problem

The magnitude of a current to be output from an in-vehicle battery system varies depending not only on the degree of deterioration of a storage battery but also on the situation. For example, depending on the traveling state or other conditions of a vehicle, it may be necessary to temporarily supply a large current to a load. In such a case, it is preferable to temporarily raise the upper limit value of the current since the influence on deterioration of the storage battery is small if it is a short time. However, in the conventional technique described in PTL 1, the upper limit value of the current is set in accordance with the degree of deterioration of the storage battery, and thus it is difficult to appropriately control the current of the storage battery depending on the situation.

Solution to Problem

A storage battery control device according to the present invention includes: a battery information acquiring unit for acquiring information on a storage battery; a first allowable current calculating unit for calculating a first allowable current of the storage battery in accordance with a rated value of a component through which a current flows by charging or discharging of the storage battery; a second allowable current calculating unit for calculating a second allowable current of the storage battery in accordance with a charging state of the storage battery on the basis of the information acquired by the battery information acquiring unit; and a third allowable current calculating unit for calculating a third allowable current of the storage battery in accordance with a deterioration state of the storage battery on the basis of the information acquired by the battery information acquiring unit.

Advantageous Effects of Invention

According to the present invention, it is possible to appropriately control the current of a storage battery depending on the situation.

DESCRIPTION OF EMBODIMENTS

An embodiment of the present invention will be described below with reference to the drawings.

Figure 1:
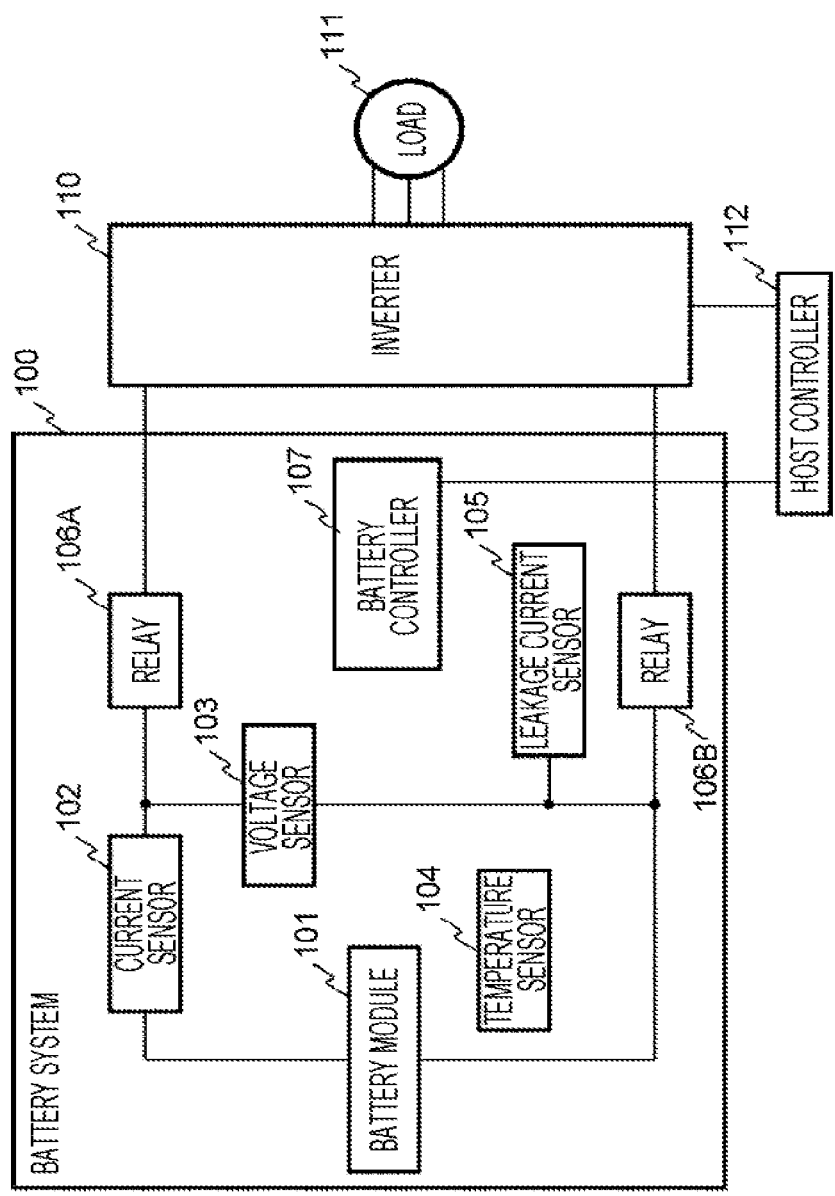
FIG. 1 is a diagram illustrating a configuration of a battery system to which a storage battery control device according to an embodiment of the present invention is applied.

FIG. 1 is a diagram illustrating a configuration of a battery system to which a storage battery control device according to an embodiment of the present invention is applied. The battery system 100 illustrated in FIG. 1 is connected to an inverter 110 and a host controller 112. A load 111 is connected to the inverter 110.

The inverter 110 is a bidirectional inverter that operates under the control of the host controller 112. The inverter 110 converts DC power supplied from the battery system 100 into AC power and outputs the AC power to the load 111. The load 111 is, for example, a three-phase AC motor mounted on a vehicle and generates a driving force of the vehicle by being rotationally driving using the AC power supplied from the inverter 110. In addition, when regenerative power generation is performed by allowing the load 111 to operate as a generator using kinetic energy of the vehicle, AC power is output from the load 111. In this case, the inverter 110 converts the AC power output from the load 111 into DC power, and outputs the obtained DC power to the battery system 100 for storage. In this manner, by operating the inverter 110 according to the control of the host controller 112, the battery system 100 is charged or discharged.

Note that the present invention is not limited to the configuration illustrated in FIG. 1 as long as charging and discharging of the battery system 100 can be appropriately controlled. For example, another charging system different from the inverter 110 may be connected to the battery system 100, and charging of the battery system 100 may be performed as needed using this charging system.

The battery system 100 includes a battery module 101, a current sensor 102, a voltage sensor 103, a temperature sensor 104, a leakage current sensor 105, a relay 106A, a relay 106B, and a battery controller 107.

The battery module 101 is a chargeable/dischargeable storage battery formed by connecting a plurality of unit batteries in series or in series and in parallel. Note that the battery module 101 may be divided into two or more groups, and a breaker which can be manually operated may be included between the groups. With this arrangement, it is possible to prevent occurrence of an electric shock accident or a short-circuit accident by opening the breaker at the time of work such as assembling, disassembling, inspection, etc. of the battery system 100.

The current sensor 102 detects a charge/discharge current flowing in the battery module 101. The voltage sensor 103 detects the voltage of the battery module 101. The temperature sensor 104 detects the temperature of the battery module 101. The leakage current sensor 105 detects the insulation resistance of the battery module 101. The detection results of the current sensor 102, the voltage sensor 103, the temperature sensor 104, and the leakage current sensor 105 are separately output to the battery controller 107.

The relays 106A and 106B are for switching electrical connection states between the battery module 101 and the inverter 110, and are controlled by the battery controller 107 or the host controller 112. The relay 106A is connected between a positive electrode side of the battery module 101 and the inverter 110, and the relay 106B is connected between a negative electrode side of the battery module 101 and the inverter 110. Note that either one of the relays 106A and 106B may be omitted. In order to limit an inrush current, a precharge relay and a resistor may be included in parallel with the relay 106A or 106B. In this case, at the time of connecting the battery module 101 and the inverter 110, it is only required to turn on the precharge relay first and, after the current becomes sufficiently small, to turn on the relay 106A or 106B and to turn off the precharge relay.

The battery controller 107 corresponds to the storage battery control device according to an embodiment of the present invention. The battery controller 107 acquires the respective detection results of the current sensor 102, the voltage sensor 103, the temperature sensor 104, and the leakage current sensor 105 and controls the battery system 100 on the basis of these detection results. For example, the battery controller 107 calculates the state of charge (SOC) or the state of health (SOH) of the battery module 101 on the basis of the detection result of a charge/discharge current by the current sensor 102 or the detection result of a voltage by the voltage sensor 103. Based on these calculation results, charge/discharge control of the battery module 101 and balancing control for equalizing SOCs of the respective unit batteries of the battery module 101 are performed. The battery controller 107 further determines whether the battery module 101 is in a leakage state or in a state where it is likely to leak on the basis of the detection result of the insulation resistance by the leakage current sensor 105. When determining that the battery module 101 is in one of these states, the battery controller 107 stops operation of the battery system 100. Other than the above, the battery controller 107 can execute various processing.

Note that, in the charge/discharge control of the battery module 101, the battery controller 107 calculates an allowable current for appropriately controlling the current flowing in the battery module 101 depending on the situation and outputs the allowable current to the host controller 112. Details of the charge/discharge control of the battery module 101 by the battery controller 107 will be described later in detail.

The host controller 112 controls an operation state of the battery system 100 or the inverter 110 on the basis of various information of the battery module 101 transmitted from the battery controller 107.

Figure 2:
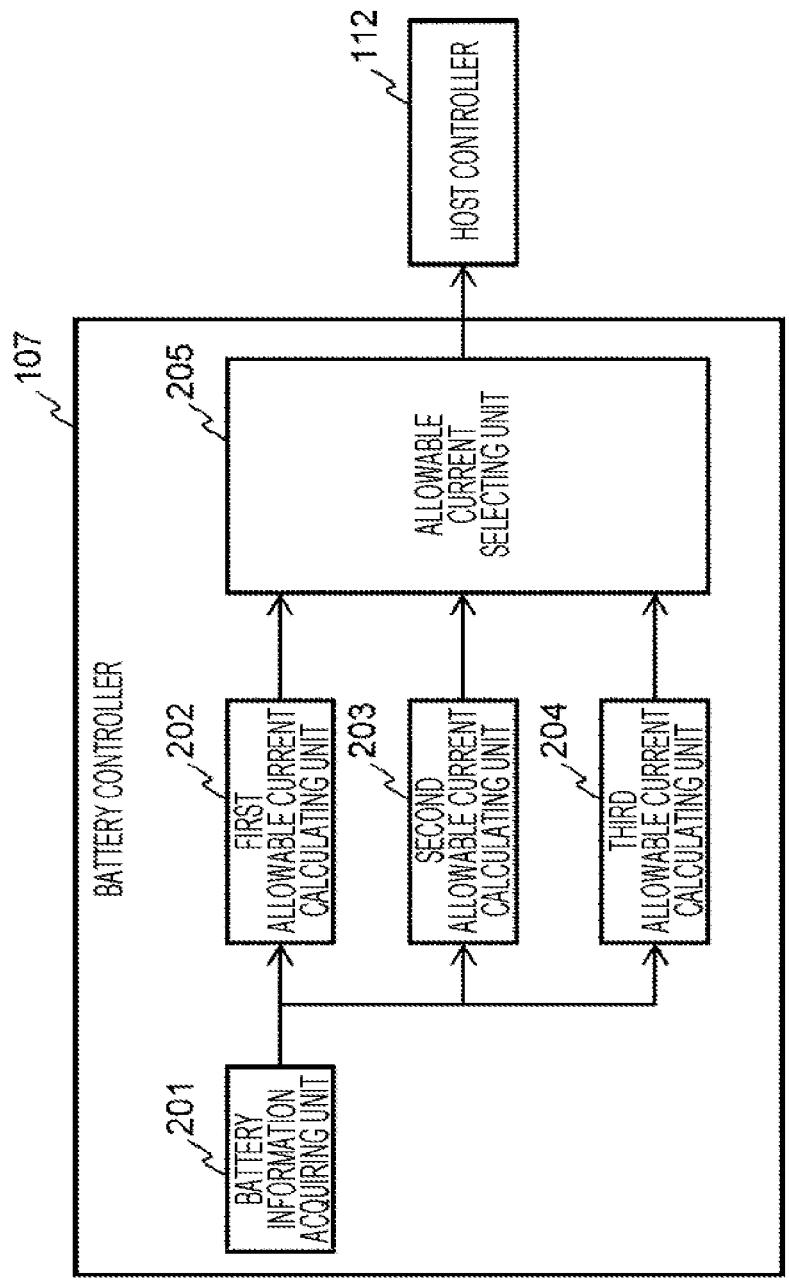
FIG. 2 is a functional block diagram of a battery controller.

Next, details of the charge/discharge control of the battery module 101 by the battery controller 107 will be described. FIG. 2 is a functional block diagram of the battery controller 107. As illustrated in FIG. 2, the battery controller 107 includes respective functional blocks including a battery information acquiring unit 201, a first allowable current calculating unit 202, a second allowable current calculating unit 203, a third allowable current calculating unit 204, and an allowable current selecting unit 205. The battery controller 107 can implement these functional blocks for example by executing a predetermined program by a CPU.

The battery information acquiring unit 201 acquires various information on the state of the battery module 101 on the basis of the respective detection results of the current sensor 102, the voltage sensor 103, and the temperature sensor 104. The battery information acquiring unit 201 acquires, for example, the charge/discharge current of the battery module 101 detected by the current sensor 102, the temperature of the battery module 101 detected by the temperature sensor 104, and the like as information of the battery module 101. Moreover, it is also possible to acquire use time of the battery module 101 measured by using a timer (not illustrated) incorporated in the battery controller 107, a traveling distance of the vehicle on which the battery module 101 is mounted, or other information as the information of the battery module 101. That is, the battery information acquiring unit 201 can acquire at least one piece of information from among the various information relating to the state of the battery module 101 as described above. Note that information other than those mentioned above may be acquired as the information of the battery module 101.

The first allowable current calculating unit 202 calculates a first allowable current of the battery module 101. The first allowable current an allowable current of the battery module 101 in accordance with a rated value of a component through which a current flows by charging or discharging of the battery module 101. Note that a specific method of calculating the first allowable current by the first allowable current calculating unit 202 will be described later with reference to FIGS. 3 and 4.

The second allowable current calculating unit 203 calculates a second allowable current of the battery module 101 on the basis of the information of the battery module 101 acquired by the battery information acquiring unit 201. The second allowable current is an allowable current of the battery module 101 in accordance with the SOC of the battery module 101. Note that a specific method of calculating the second allowable current by the second allowable current calculating unit 203 will be described later with reference to FIGS. 5 and 6.

The third allowable current calculating unit 204 calculates a third allowable current of the battery module 101 on the basis of the information of the battery module 101 acquired by the battery information acquiring unit 201. The third allowable current is an allowable current of the battery module 101 in accordance with the SOH of the battery module 101. Note that a specific method of calculating the third allowable current by the third allowable current calculating unit 204 will be described later with reference to FIG. 7.

The allowable current selecting unit 205 selects one of the first allowable current, the second allowable current, and the third allowable current calculated by the first allowable current calculating unit 202, the second allowable current calculating unit 203, and the third allowable current calculating unit 204, respectively. Note that a specific method of selecting an allowable current by the allowable current selecting unit 205 will be described later. Then, a value of the selected allowable current is output to the host controller 112. When the allowable current is output from the allowable current selecting unit 205, the host controller 112 controls the battery system 100 and the inverter 110 in accordance with the value of the allowable current to perform charge/discharge control of the battery module 101.

Figure 3:
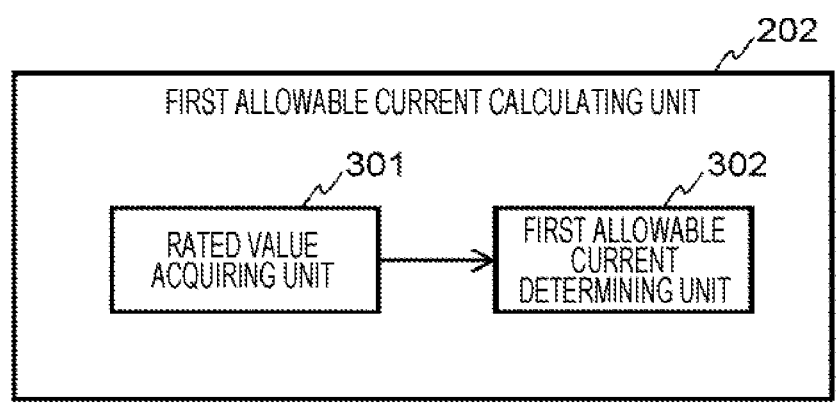
FIG. 3 is a functional block diagram of a first allowable current calculating unit.

Next, a method of calculating the first allowable current by the first allowable current calculating unit 202 will be described. FIG. 3 is a functional block diagram of the first allowable current calculating unit 202. As illustrated in FIG. 3, the first allowable current calculating unit 202 includes respective functional blocks including a rated value acquiring unit 301 and a first allowable current determining unit 302.

The rated value acquiring unit 301 acquires, as a rated value related to the first allowable current, a rated current value of each components through which a current flows by charging or discharging of the battery module 101 out of various electric components forming the battery system 100. For example, the rated value acquiring unit 301 acquires a rated current value of various components such as a bus bar, a connector, a current cable, a relay (switch), a fuse, or a screw arranged on the path of charging/discharging current in the battery system 100. Note that in a case where a shunt resistor, adhesive resin, or the like is arranged on a path of the charge/discharge current, the rated value acquiring unit 301 also acquires these rated current values. For example, the rated value acquiring unit 301 prestores a temperature characteristic of a rated current value of each component. The temperature of each component is estimated on the basis of the temperature of the battery module 101 detected by the temperature sensor 104, and then a rated current value corresponding to the temperature is acquired for each component. At this time, furthermore, a deterioration state of each component may be estimated on the basis of a use history of the battery system 100, and a rated current value of each component may be determined in consideration of the estimation result.

The first allowable current determining unit 302 determines the first allowable current on the basis of the rated current value of each component acquired by the rated value acquiring unit 301. For example, the first allowable current determining unit 302 determines the first allowable current in accordance with a component having the smallest rated current value.

Figure 4:
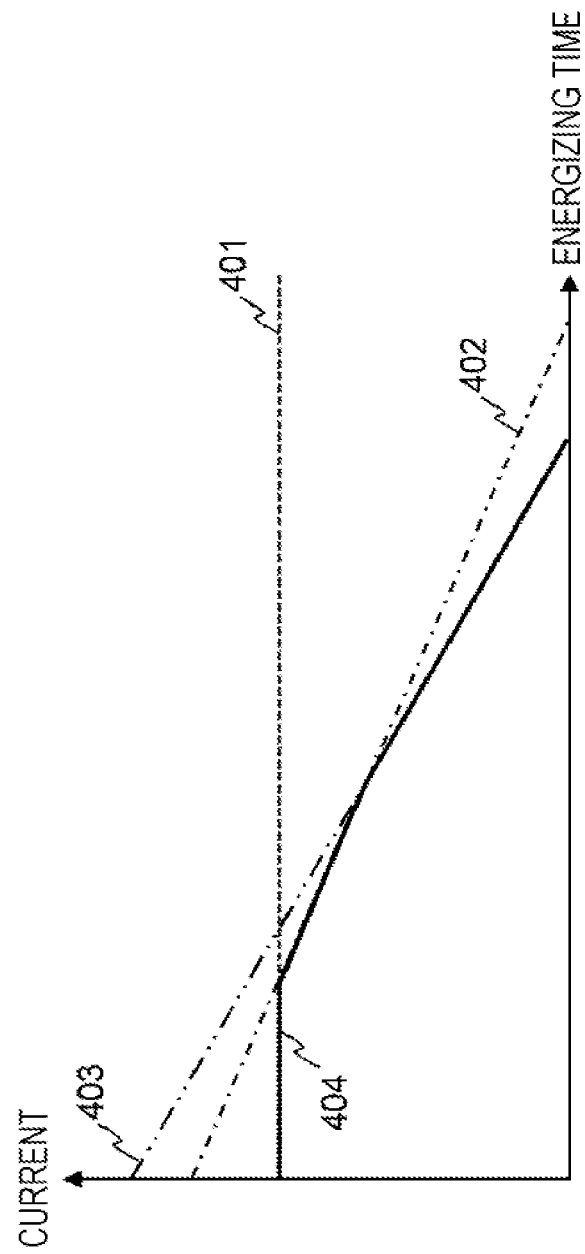
FIG. 4 is a diagram explaining a method of determining a first allowable current.

FIG. 4 is a diagram explaining a method of determining the first allowable current by the first allowable current determining unit 302. In FIG. 4, each of straight lines 401, 402, and 403 represents a characteristic example of a rated current value with respect to energizing time of a component different from each other. The components of the battery system 100 include, in a mixed manner, a rated current value being constant irrespective of energizing time as illustrated by the straight line 401 and those whose rated current value decreases as energizing time becomes longer (as an energizing duty becomes larger) as separately illustrated by the straight lines 402 and 403. In a case where these rated current values are acquired by the rated value acquiring unit 301, the first allowable current determining unit 302 can determine the first allowable current according to a characteristic of a rated current value with respect to energizing time as indicated by a polygonal line 404, for example.

Figure 5:
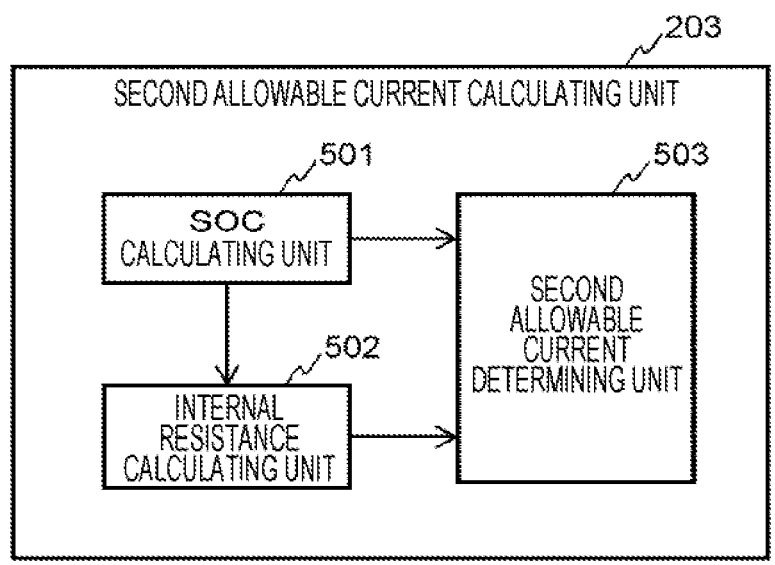
FIG. 5 is a functional block diagram of a second allowable current calculating unit.

Next, a method of calculating the second allowable current by the second allowable current calculating unit 203 will be described. FIG. 5 is a functional block diagram of the second allowable current calculating unit 203. As illustrated in FIG. 5, the second allowable current calculating unit 203 includes respective functional blocks including an SOC calculating unit 501, an internal resistance calculating unit 502, and a second allowable current determining unit 503.

The SOC calculating unit 501 calculates an SOC of the battery module 101 on the basis of the detection result of a charge/discharge current by the current sensor 102 or the detection result of a voltage by the voltage sensor 103. For example, the SOC calculating unit 501 can derive an SOC from an integrated value of charging or discharging currents or derive an SOC from an open circuit voltage (OCV) when the battery module 101 is not charged/discharged.

The internal resistance calculating unit 502 calculates an internal resistance value of the battery module 101 on the basis of the SOC derived by the SOC calculating unit 501. The internal resistance calculating unit 502 can calculate the internal resistance value of the battery module 101 on the basis of the OCV derived from the SOC, the detection result of the charge/discharge current by the current sensor 102, and the voltage detection result at the time of charging or discharging by the voltage sensor 103. At this time, the internal resistance value of the battery module 101 may be derived in consideration of the temperature detected by the temperature sensor 104.

The second allowable current determining unit 503 determines the second allowable current on the basis of the SOC derived by the SOC calculating unit 501 and the internal resistance derived by the internal resistance calculating unit 502.

Figure 6:
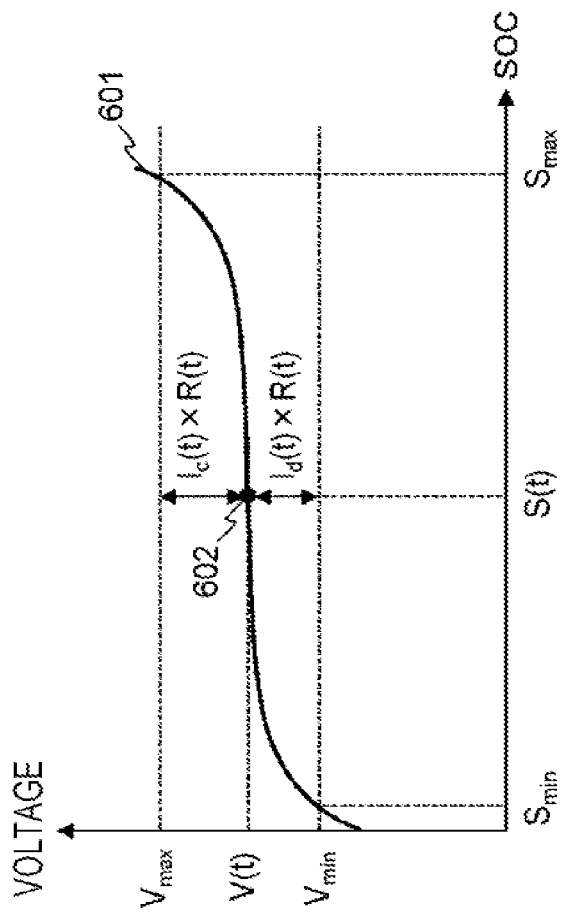
FIG. 6 is a diagram explaining a method of determining a second allowable current.

FIG. 6 is a diagram explaining a method of determining the second allowable current by the second allowable current determining unit 503. In FIG. 6, a curve 601 illustrates an example of an SOC-OCV curve representing the relationship between the SOC and the OCV of the battery module 101. When the maximum value and the minimum value of the SOC in which the battery module 101 is used are denoted by Smax and Smin, respectively, the maximum value Vmax and the minimum value Vmin of the OCV of the battery module 101 are derived as points corresponding to Smax and Smin on the SOC-OCV curve 601 as illustrated in FIG. 6.

Here, when values of the SOC and the OCV at desired time t are represented as S(t) and V(t), respectively, these values can be represented by a point on the SOC-OCV curve 601, for example, a point 602. When a charge allowable current and a discharge allowable current of the battery module 101 at this time are denoted by Ic(t) and Id(t), respectively, a relationship as illustrated in FIG. 6 holds between the point 602 and these currents. In FIG. 6, R(t) represents the internal resistance of the battery module 101 at time t.

The above relationship is represented by the following mathematical formula (1).

$$V(t) = Vmax - Ic(t)$$
$$= Vmin + Id(t) \times R(t) \quad (1)$$

From the mathematical formula (1), the following mathematical formulas (2) and (3) are derived as equations for deriving a charge allowable current Ic(t) and a discharge allowable current Id(t).

$$Ic(t)=\{V\max-V(t)\}/R(t) \quad (2)$$

$$Id(t)=\{V(t)-V\min\}/R(t) \quad (3)$$

The second allowable current determining unit 503 can determine the second allowable current by deriving the charge allowable current Ic(t) and the discharge allowable current Id(t) on the basis of the above mathematical formulas (2) and (3), respectively.

Figure 7:
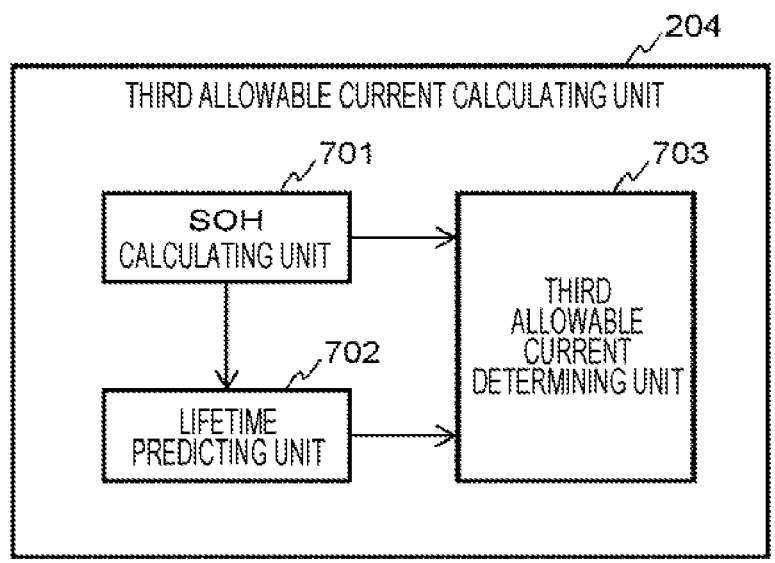
FIG. 7 is a functional block diagram of a third allowable current calculating unit.

Next, a method of calculating the third allowable current by the third allowable current calculating unit 204 will be described. FIG. 7 is a functional block diagram of the third allowable current calculating unit 204. As illustrated in FIG. 7, the third allowable current calculating unit 204 includes respective functional blocks including an SOH calculating unit 701, a lifetime predicting unit 702, and a third allowable current determining unit 703.

The SOH calculating unit 701 calculates an SOH of the battery module 101 on the basis of the detection result of a charge/discharge current by the current sensor 102 or the detection result of a voltage by the voltage sensor 103. Note that the calculation results of the SOC and the internal resistance may be acquired from the second allowable current calculating unit 203, and the SOH may be calculated on the basis of these calculation results.

The lifetime predicting unit 702 predicts a lifetime of the battery module 101 on the basis of the SOH calculated by the SOH calculating unit 701. The lifetime predicting unit 702 records a history of the information of the battery module 101 acquired by the battery information acquiring unit 201 in association with the SOH of the battery module 101, for example. Estimating the future transition of the SOH on the basis of the information recorded in this manner enables calculating the deterioration progression speed of the battery module 101 and predicting the lifetime from the calculation result.

The third allowable current determining unit 703 determines the third allowable current on the basis of the SOH derived by the SOH calculating unit 701 and the lifetime derived by the lifetime predicting unit 702. The third allowable current determining unit 703 compares the lifetime of the battery module 101 predicted by the lifetime predicting unit 702 with a preset target lifetime value. As a result, if a deviation between the target lifetime value and the predicted lifetime value is large, a value of the third allowable current is adjusted such that the deviation becomes smaller. As a result, the third allowable current calculating unit 204 can calculate the third allowable current corresponding to the SOH of the battery module 101.

Figure 8:
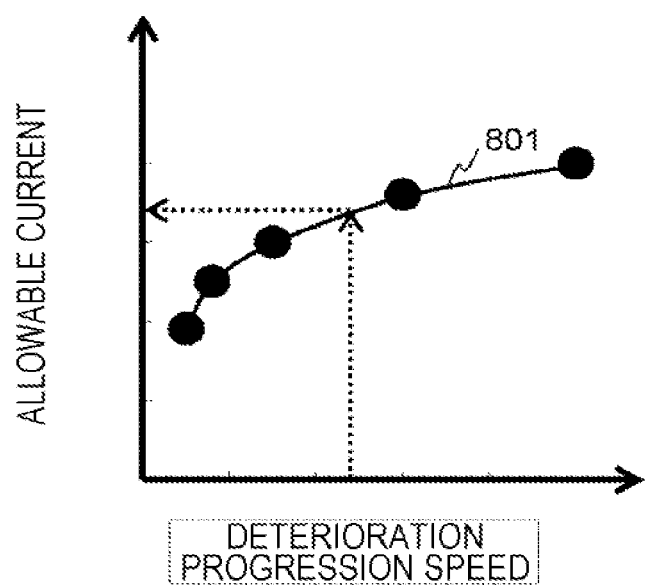
FIG. 8 is a diagram explaining a method of determining a third allowable current.

FIG. 8 is a diagram explaining a method of determining the third allowable current by the third allowable current determining unit 703. In FIG. 8, a curve 801 illustrates an example of the relationship between the deterioration progression speed and the third allowable current. The third allowable current determining unit 703 stores data in which the relationship of FIG. 8 having been obtained in advance by a test or the like is mapped, for example. By using this data, the third allowable current determining unit 703 can determine the third allowable current in accordance with the deterioration progression speed of the battery module 101.

Figure 9:
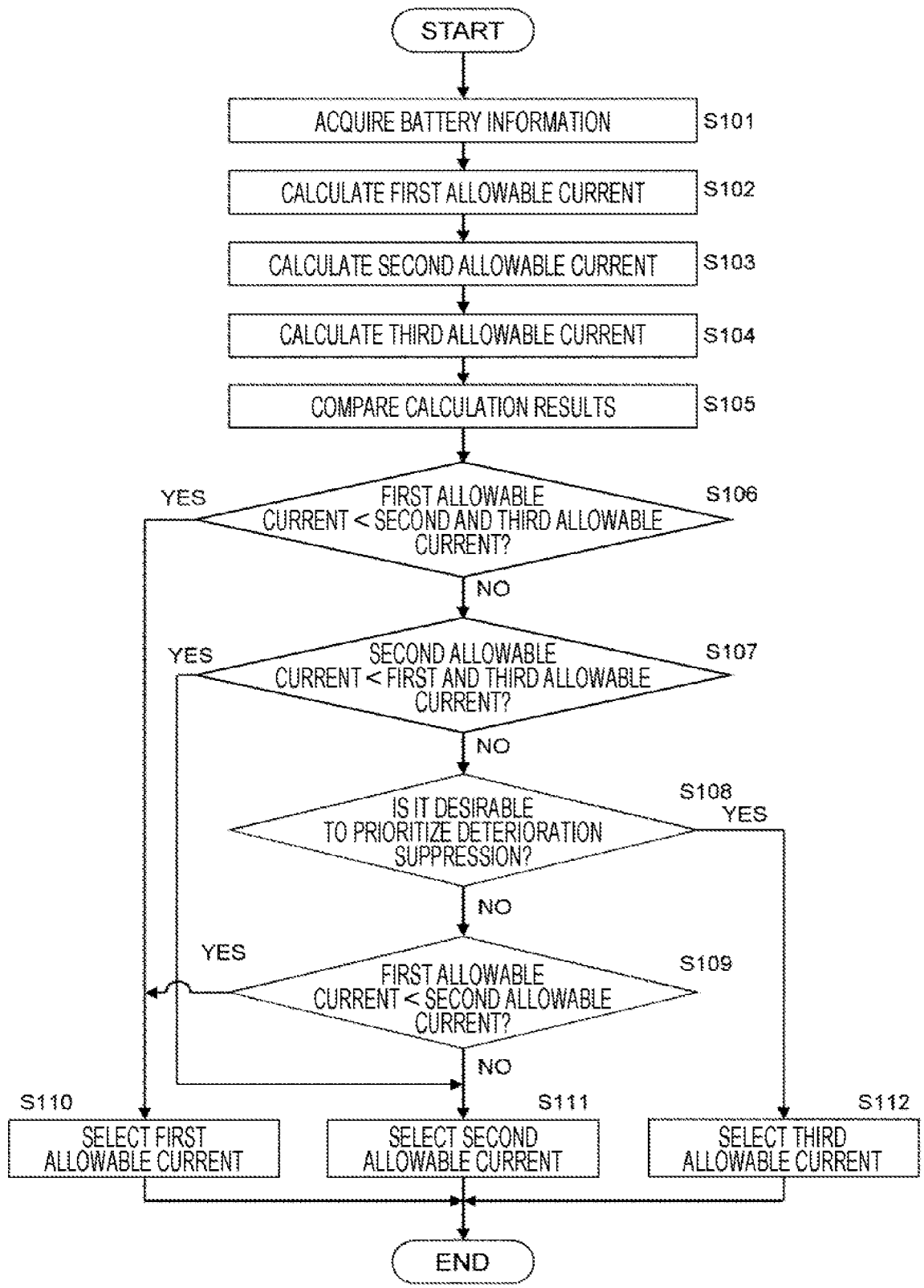
FIG. 9 is a flowchart of charge/discharge control of a battery module.

FIG. 9 is a flowchart of charge/discharge control of the battery module 101 by the battery controller 107. The battery controller 107 executes charge/discharge control of the battery module 101 at every predetermined processing cycle according to the flowchart of FIG. 9.

In step S101, the battery controller 107 acquires the various information of the battery module 101 as described above by the battery information acquiring unit 201.

In step S102, the battery controller 107 calculates the first allowable current of the battery module 101 on the basis of the information of the battery module 101 acquired in step S101 by the first allowable current calculating unit 202.

In step S103, the battery controller 107 calculates the second allowable current of the battery module 101 on the basis of the information of the battery module 101 acquired in step S101 by the second allowable current calculating unit 203.

In step S104, the battery controller 107 calculates the third allowable current of the battery module 101 on the basis of the information of the battery module 101 acquired in step S101 by the third allowable current calculating unit 204.

In step S105, the battery controller 107 compares the calculation results of steps S102 to S104 by the allowable current selecting unit 205. That is, the first allowable current calculated in step S102, the second allowable current calculated in step S103, and the third allowable current calculated in step S104 are compared to grasp the magnitude relation among them.

In step S106, the battery controller 107 determines whether the first allowable current is lower than both of the second allowable current and the third allowable current on the basis of the comparison result of step S105 by the allowable current selecting unit 205. As a result, if the determination condition is satisfied, that is, if the first allowable current is the lowest, the processing proceeds to step S109. On the other hand, if the determination condition is not satisfied, that is, if the first allowable current is higher than at least one of the second allowable current and the third allowable current, the processing proceeds to step S106.

In step S107, the battery controller 107 determines whether the second allowable current is lower than both of the first allowable current and the third allowable current on the basis of the comparison result of step S105 by the allowable current selecting unit 205. As a result, if the determination condition is satisfied, that is, if the second allowable current is the lowest, the processing proceeds to step S111. On the other hand, if the determination condition is not satisfied, that is, if the second allowable current is higher than at least one of the first allowable current and the third allowable current, the processing proceeds to step S108.

In step S108, the battery controller 107 determines whether deterioration suppression of the battery module 101 is to be prioritized in the current situation by the allowable current selecting unit 205. The allowable current selecting unit 205 determines that the deterioration suppression of the battery module 101 is to be prioritized in cases such as a case where a mode that gives priority to the lifetime of the battery module 101 is set in the battery system 100 or a case where the load of the battery module 101 is small such as when the vehicle is traveling. On the other hand, the allowable current selecting unit 205 determines that the deterioration suppression of the battery module 101 is not to be prioritized in cases such as a case where a mode that gives priority to the traveling performance or fuel efficiency of the vehicle is set in the battery system 100 or when the load of the battery module 101 is large such as during acceleration of the vehicle. As a specific example, a case is considered where the battery system 100 is mounted in an electric vehicle such as a hybrid car. In such a case, when the vehicle travels on an approach road to a highway or on an uphill road or overtakes, a driver may presses on the accelerator pedal deeper and request a higher output torque from the load 111 that is an electric motor. If the allowable current selecting unit 205 has determined whether the request for a higher output has been made and determined that the request for a higher output has been made on the basis of an amount of change in the degree of accelerator opening, the allowable current selecting unit 205 can determine that the charge/discharge performance of the battery module 101 is to be prioritized and that the deterioration suppression is not to be prioritized. Note that, other than the above, the determination in step S108 can be performed using various determination conditions. As a result, if it is determined that the deterioration suppression is to be prioritized, the processing proceeds to step S112. On the other hand, if it is determined that the deterioration suppression is not to be prioritized, the processing proceeds to step S109.

In step S109, the battery controller 107 determines whether the first allowable current is lower than the second allowable current on the basis of the comparison result of step S105 by the allowable current selecting unit 205. As a result, if the first allowable current is lower than the second allowable current, the processing proceeds to step S110. On the other hand, if the first allowable current is greater than or equal to the second allowable current, the processing proceeds to step S111.

In step S110, the battery controller 107 selects the first allowable current obtained in step S102 by the allowable current selecting unit 205 and outputs the first allowable current to the host controller 112. That is, if the first allowable current is lower than the second allowable current and the third allowable current, or if the deterioration suppression is not to be prioritized and the first allowable current is lower than the second allowable current, the battery controller 107 executes step S110. As a result, the first allowable current is selected as the allowable current in the charge/discharge control of the battery module 101.

In step S111, the battery controller 107 selects the second allowable current obtained in step S103 by the allowable current selecting unit 205 and outputs the second allowable current to the host controller 112. That is, if the second allowable current is lower than the first allowable current and the third allowable current, or if the deterioration suppression is not to be prioritized and the second allowable current is lower than the first allowable current, the battery controller 107 executes step S111. As a result, the second allowable current is selected as the allowable current in the charge/discharge control of the battery module 101.

In step S112, the battery controller 107 selects the third allowable current obtained in step S104 by the allowable current selecting unit 205 and outputs the third allowable current to the host controller 112. That is, if the deterioration suppression is to be prioritized, the battery controller 107 executes step S112. As a result, the third allowable current is selected as the allowable current in the charge/discharge control of the battery module 101.

After executing any one of steps S110 to S112, the battery controller 107 completes the processing illustrated in the flowchart of FIG. 9.

Figure 10:
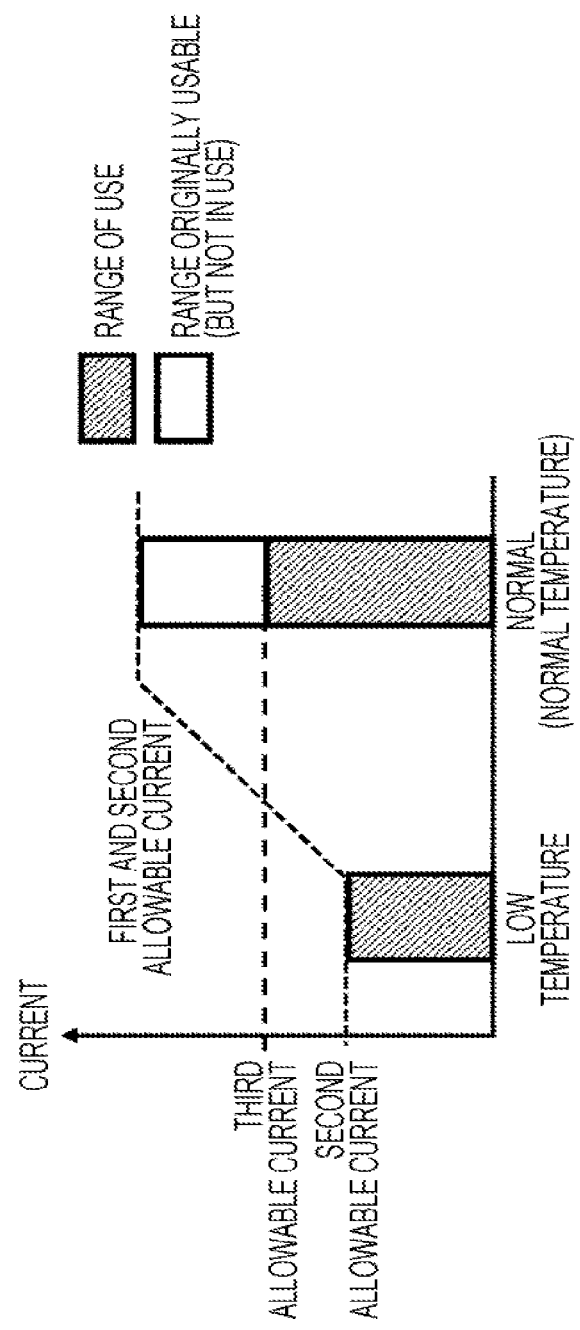
FIG. 10 is a diagram illustrating an example of a change in an allowable current in the case of using a conventional technique.

Hereinafter, effects of the present invention will be described with reference to FIGS. 10, 11, and 12. FIG. 10 illustrates an example of a change in an allowable current in the case of using the conventional technique. Generally in a battery system using a storage battery, as in the case of the first allowable current, the second allowable current, and the third allowable current described above, there are a plurality of allowable currents defined from different perspectives such as safety of parts, safety of the storage battery, and a lifetime of the storage battery. However, in a case where the minimum value of these allowable currents is used as an allowable current of a battery system as in the related art, charge/discharge control cannot be performed beyond this minimum allowable current. Therefore, as illustrated in FIG. 10, in such a case where the magnitude relationship of allowable currents differs between low temperature and normal temperature and the third allowable current is lower than the first and the second allowable currents at normal temperature, charge/discharge control is always performed according to the minimum allowable current although there is no problem even if the charge/discharge current temporarily exceeds the third allowable current. As a result, it is not possible to perform charging or discharging utilizing a range originally available at a room temperature, and the performance of the battery system cannot be exerted at the maximum when necessary.

Figure 11:
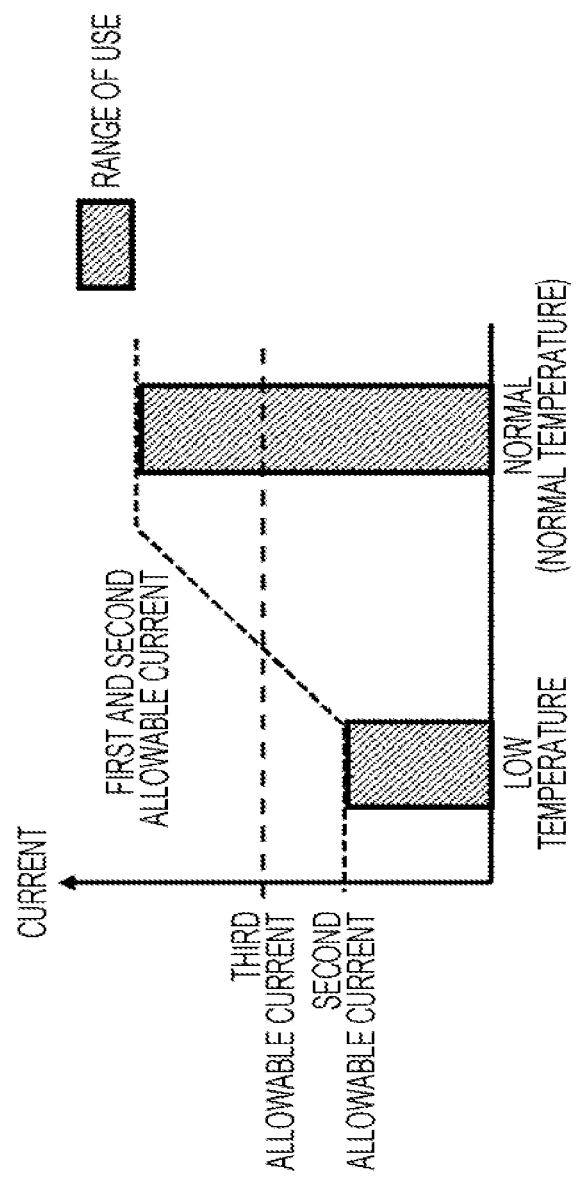
FIG. 11 is a diagram illustrating an example of a change in an allowable current in the case of using the present invention.

On the other hand, FIG. 11 illustrates an example of a change in an allowable current in the case of using the present invention. In the present invention, as described in the above embodiment, the first, the second, and the third allowable currents defined from different perspectives can be selectively used depending on the situation. Therefore, when a request for higher output is made to the battery system 100 in the case as described above, as illustrated in FIG. 11, it is possible to use a smaller one of the first allowable current and the second allowable current as the allowable current to temporarily increase the allowable current. As a result, it is possible to make the full use of the charge/discharge performance of the battery system.

Figure 12:
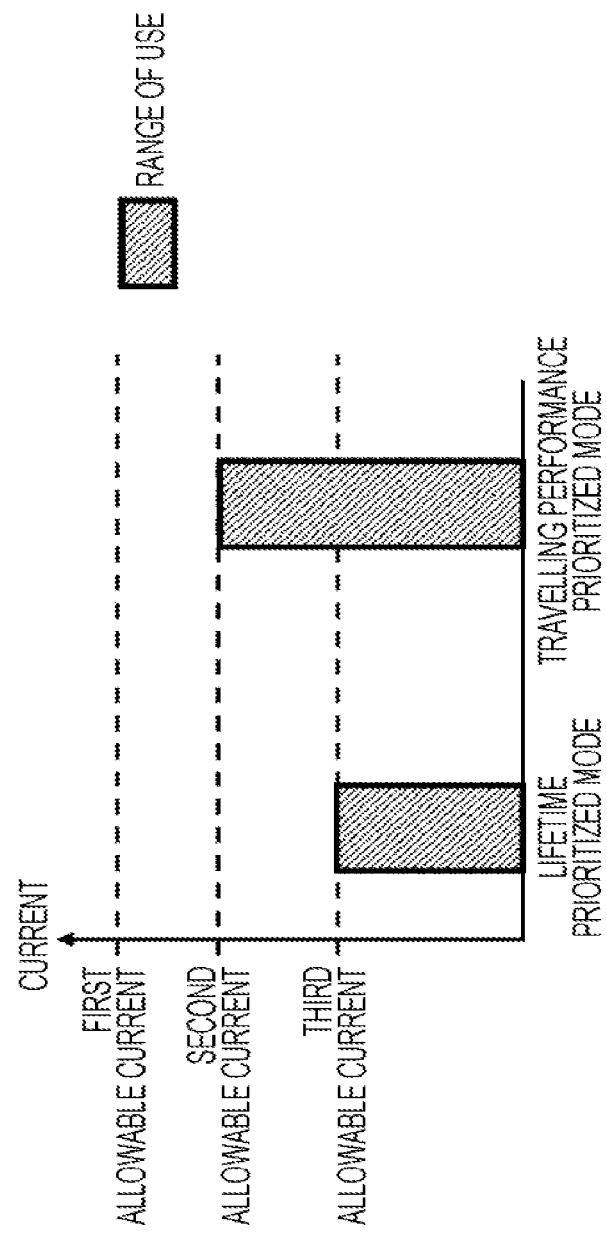
FIG. 12 is a diagram illustrating an example of a change in an allowable current in a case where the present invention is more proactively utilized.

FIG. 12 illustrates an example of a change in an allowable current when the present invention is more proactively utilized. For example, it is assumed that the battery system 100 is mounted to an electric vehicle such as a hybrid car and has a function that allows a driver to select between a mode that gives priority to the lifetime of the battery module 101 and a mode that gives priority to the traveling performance such as fuel consumption and acceleration performance. In such a case, as illustrated in FIG. 12, the battery system 100 uses the third allowable current as the allowable current when the driver selects the lifetime prioritized mode and, when the traveling performance prioritized mode is selected, a smaller one of the first and the second allowable currents is used as the allowable current. In this manner, it is also possible to employ a system in which an allowable current is selected in accordance with the selection of the driver.

According to the embodiment of the present invention described above, the following operational effects are obtained.

(1) The battery controller 107 includes the battery information acquiring unit 201, the first allowable current calculating unit 202, the second allowable current calculating unit 203, and the third allowable current calculating unit 204.

The battery information acquiring unit 201 acquires information on the battery module 101 which is a storage battery (step S101). The first allowable current calculating unit 202 calculates the first allowable current of the battery module 101 in accordance with a rated value of a component through which a current flows by charging or discharging of the battery module 101 (step S102). The second allowable current calculating unit 203 calculates the second allowable current of the battery module 101 in accordance with an SOC of the battery module 101 on the basis of the information acquired by the battery information acquiring unit 201 (step S103). The third allowable current calculating unit 204 calculates the third allowable current of the battery module 101 in accordance with an SOH of the battery module 101 on the basis of the information acquired by the battery information acquiring unit 201 (step S104). In this manner, it is possible to appropriately control the current of the battery module 101 depending on the situation on the basis of the calculation results of these allowable currents.

(2) The battery controller 107 further includes the allowable current selecting unit 205 for selecting and outputting any one of the first allowable current, the second allowable current, and the third allowable current. In this manner, it is possible to select an appropriate allowable current depending on the situation and to use the allowable current in the charge/discharge control of the battery module 101.

(3) In a case where the first allowable current is lower than the second allowable current and the third allowable current (step S106), the allowable current selecting unit 205 selects the first allowable current (step S110), and the allowable current selecting unit 205 selects the second allowable current in a case where the second allowable current is lower than the first allowable current and the third allowable current (step S111). In this manner, in a case where any one of the first allowable current and the second allowable current is the lowest, the charge/discharge control of the battery module 101 can be performed in accordance with the lowest allowable current. Therefore, it is possible to prevent failure of the battery system 100 and to maintain the performance of the battery module 101.

(4) The allowable current selecting unit 205 determines whether deterioration suppression of the battery module 101 is to be prioritized (step S108). As a result, if it is determined that the deterioration suppression of the battery module 101 is to be prioritized, the third allowable current is selected (step S112). If it is determined that the deterioration suppression of the battery module 101 is not to be prioritized, the first allowable current or the second allowable current is selected (steps S110 and S111). In this manner, when the deterioration suppression of the battery module 101 is to be prioritized, the charge/discharge control of the battery module 101 can be performed in accordance with the third allowable current. Therefore, deterioration of the battery module 101 can be suppressed, and the lifetime can be secured.

Note that in the embodiment described above, the example in which the battery controller 107 includes the allowable current selecting unit 205 has been described; however, the function of the allowable current selecting unit 205 may be implemented in the host controller 112. In this case, the battery controller 107 executes the processing of steps S101 to S104 in FIG. 9 and outputs the values of the obtained first allowable current, the second allowable current, and the third allowable current to the host controller 112. The host controller 112 executes the processing of steps S105 to S112 on the basis of these allowable currents output from the battery controller 107 and selects one of the first allowable current, the second allowable current, and the third allowable current. Then, the charge/discharge control of the battery module 101 is performed in accordance with the selected allowable current. Also in this manner, actions and effects similar to the above can be obtained.

The present invention is not limited to the above embodiment. Other aspects conceivable within the range of technical ideas of the present invention are also included within the scope of the present invention.

REFERENCE SIGNS LIST

100: battery system
101: battery module
102: current sensor
103: voltage sensor
104: temperature sensor
105: leakage current sensor
106A, 106B: relay
107: battery controller
110: inverter
111: load
112: host controller
201: battery information acquiring unit
202: first allowable current calculating unit
203: second allowable current calculating unit
204: third allowable current calculating unit
205: allowable current selecting unit

The invention claimed is:

1. A storage battery control device, comprising:
a processor programmed to execute a program stored in memory, wherein the program causes the processor to:
acquire information on a storage battery;
calculate a first allowable current of the storage battery in accordance with a rated value of a component through which a current flows by charging or discharging of the storage battery;
calculate a second allowable current of the storage battery in accordance with a charging state of the storage battery based on the information;
calculate a third allowable current of the storage battery in accordance with a deterioration state of the storage battery based on the information;
determine whether deterioration suppression of the storage battery is to be prioritized;
select a smallest allowable current of the first allowable current, the second allowable current and the third allowable current, when determining that the deterioration suppression of the storage battery is to be prioritized;
select a smaller allowable current of the first allowable current and the second allowable current, when determining that the deterioration suppression of the storage battery is not to be prioritized; and
determine that the deterioration suppression of the storage battery is not to be prioritized, while a higher output torque of an electric motor which is a load of the storage battery is requested.

2. An electric vehicle, comprising:
the storage battery control device according to claim 1; and
an electric motor which is a load of a storage battery controlled by the storage battery control device.

3. The electric vehicle according to claim 2, further comprising:
a system including the storage battery control device, wherein the system is configured to allow a driver of the electric vehicle to select any one of a first mode that gives priority to a lifetime of the storage battery and a second mode that gives priority to a traveling performance of the electric vehicle.

4. The electric vehicle according to claim 3,
wherein the system is configured to select the smaller allowable current of the first allowable current and the second allowable current, when the second mode is selected by the driver.

* * * * *